US010665698B2

(12) United States Patent
Lee et al.

(10) Patent No.: US 10,665,698 B2
(45) Date of Patent: May 26, 2020

(54) REDUCING GATE-INDUCED-DRAIN-LEAKAGE CURRENT IN A TRANSISTOR BY FORMING AN ENHANCED BAND GAP LAYER AT THE CHANNEL-TO-DRAIN INTERFACE

(71) Applicant: International Business Machines Corporation, Armonk, NY (US)

(72) Inventors: Choonghyun Lee, Rensselaer, NY (US); Kangguo Cheng, Schenectady, NY (US); Juntao Li, Cohoes, NY (US); Shogo Mochizuki, Clifton Park, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/165,440

(22) Filed: Oct. 19, 2018

(65) Prior Publication Data
US 2020/0127122 A1    Apr. 23, 2020

(51) Int. Cl.
*H01L 29/66*    (2006.01)
*H01L 29/10*    (2006.01)
(Continued)

(52) U.S. Cl.
CPC .. *H01L 29/66795* (2013.01); *H01L 21/02164* (2013.01); *H01L 21/02236* (2013.01);
(Continued)

(58) Field of Classification Search
CPC ........... H01L 29/66795; H01L 29/1033; H01L 29/7848; H01L 29/165; H01L 29/7851;
(Continued)

(56) References Cited

U.S. PATENT DOCUMENTS 8,895,395 B1   11/2014   Kerber et al.
9,634,142 B1    4/2017   Schepis et al.
(Continued)

OTHER PUBLICATIONS

Lee et al., "Engineering the Electronic Defect Bands at the Si 1-x Ge x/IL Interface: Approaching the Intrinsic Carrier Transport in Compressively-Strained Si 1-x Ge x pFETs," International Electron Devices Meeting (IEDM), IEEE, 2016 4 pages.
(Continued)

*Primary Examiner* — Sitaramarao S Yechuri
(74) *Attorney, Agent, or Firm* — Cantor Colburn LLP; Vazken Alexanian

(57) ABSTRACT

Embodiments of the invention are directed to a method of forming a semiconductor device. The method includes forming a channel region comprising a channel region semiconductor material having a first energy band gap characteristic. A source region is formed communicatively coupled to the channel region. A drain region is formed communicatively coupled to the channel region. A gate region is formed communicatively coupled to the channel region. An enhanced band gap region is positioned substantially positioned at an interface between the channel region and the drain region. The enhanced band gap region includes an enhanced band gap region semiconductor material having a second band gap energy characteristic. The first energy band gap is less than the second energy band gap.

14 Claims, 12 Drawing Sheets

(51) Int. Cl.
  *H01L 29/08* (2006.01)
  *H01L 21/324* (2006.01)
  *H01L 21/02* (2006.01)
  *H01L 21/225* (2006.01)
  *H01L 29/78* (2006.01)
  *H01L 29/165* (2006.01)
  *H01L 29/167* (2006.01)

(52) U.S. Cl.
  CPC .... *H01L 21/02532* (2013.01); *H01L 21/2256* (2013.01); *H01L 21/324* (2013.01); *H01L 29/0847* (2013.01); *H01L 29/1033* (2013.01); *H01L 29/165* (2013.01); *H01L 29/7848* (2013.01); *H01L 29/7851* (2013.01); *H01L 21/02255* (2013.01); *H01L 29/167* (2013.01); *H01L 29/66545* (2013.01)

(58) Field of Classification Search
  CPC ........... H01L 29/0847; H01L 29/66545; H01L 29/167; H01L 21/02236; H01L 21/02164; H01L 21/2256; H01L 21/02532; H01L 21/324; H01L 21/02255
  See application file for complete search history.

(56) References Cited

U.S. PATENT DOCUMENTS

| | | | |
|---|---|---|---|
| 9,647,115 | B1 | 5/2017 | Okuno et al. |
| 9,741,822 | B1 | 8/2017 | Jagannathan et al. |
| 9,773,875 | B1* | 9/2017 | Jagannathan ......... H01L 29/165 |
| 9,812,571 | B2 | 11/2017 | Doris et al. |
| 2005/0173763 | A1* | 8/2005 | Takeguchi ........ H01L 29/66757 257/347 |
| 2009/0072238 | A1* | 3/2009 | Yamazaki ......... H01L 21/76897 257/72 |
| 2015/0228653 | A1 | 8/2015 | Cheng et al. |
| 2017/0263708 | A1* | 9/2017 | Then ................. H01L 29/66469 |
| 2018/0026100 | A1 | 1/2018 | Jagannathan et al. |
| 2018/0076040 | A1 | 3/2018 | Ando et al. |
| 2018/0190653 | A1* | 7/2018 | Lu ...................... H01L 27/0886 |
| 2019/0067457 | A1* | 2/2019 | More ..................... H01L 21/28 |

OTHER PUBLICATIONS

Niu et al., "Interface Preservation During Ge-Rich Source/Drain Contact Formation," 27th Annual SEMI Advanced Semiconductor Manufacturing Conference (ASMC), 2016, pp. 320-323.

* cited by examiner

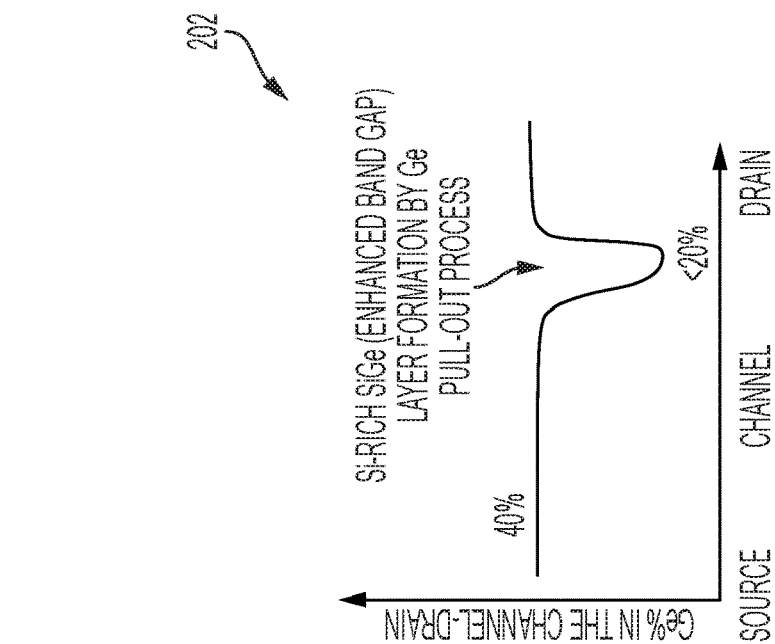
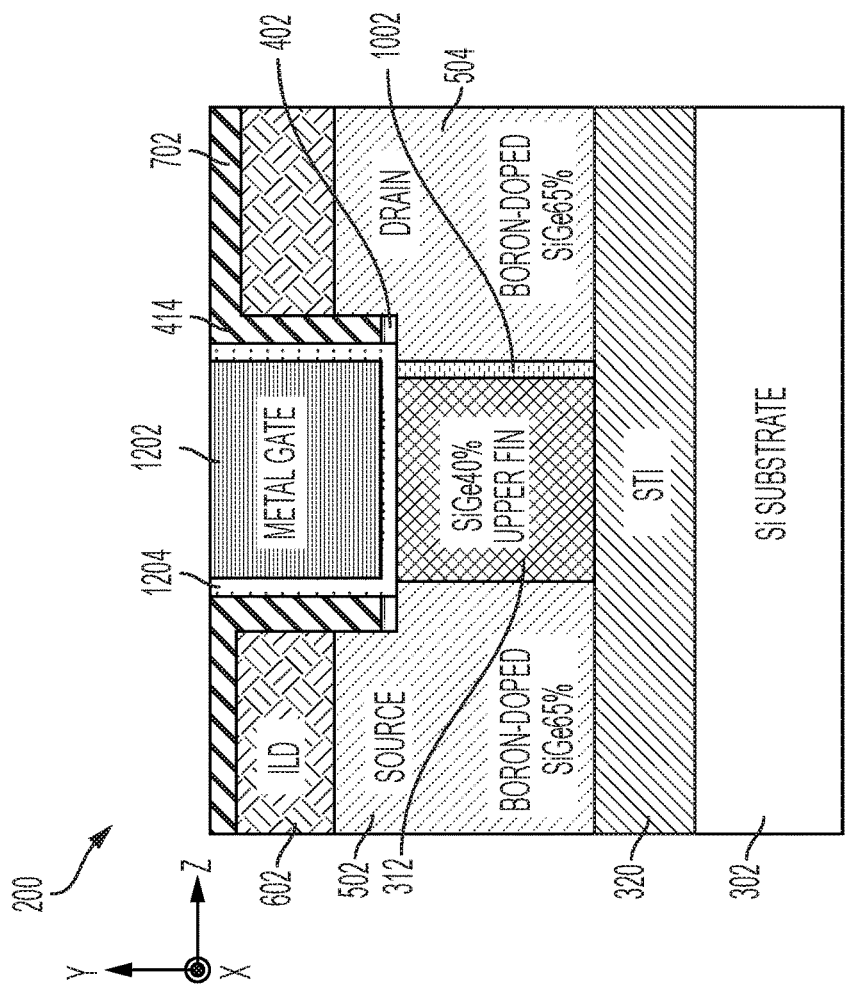
FIG. 2

REDUCING GATE-INDUCED-DRAIN-LEAKAGE CURRENT IN A TRANSISTOR BY FORMING AN ENHANCED BAND GAP LAYER AT THE CHANNEL-TO-DRAIN INTERFACE

BACKGROUND

The present invention relates in general to semiconductor devices for use in integrated circuits (ICs). More specifically, the present invention relates to improved fabrication methods and resulting structures for reducing gate-induced-drain-leakage (GIDL) currents by forming an enhanced band gap layer at the channel-to-drain interface of a field effect transistor (FET), wherein the enhanced band gap layer is formed from a material having a larger band gap than the FET's channel region.

Metal-oxide-semiconductor field-effect transistors (MOSFETs) are used to amplify or switch electronic signals. A MOSFET has a source, a drain, and a metal oxide gate electrode. The metal oxide gate electrode includes a metal portion and a gate oxide portion. The metal gate portion is electrically insulated from the main semiconductor n-channel or p-channel by the oxide portion. The gate oxide portion of the gate electrode can be implemented as a thin layer of insulating material, for example, silicon dioxide or glass, which makes the input resistance of the MOSFET relatively high. The gate voltage controls whether the current path from the source to the drain is an open circuit ("off") or a resistive path ("on").

GIDL current is undesired and can occur in MOSFETs due to the high electric field between the gate and the drain. Significant GIDL current can be detected in thin gate oxide MOSFETs at drain voltages much lower than the junction breakdown voltage. The mechanism responsible for GIDL current is MOSFETs is the band-to-band tunneling that can occur in the reverse biased channel-drain interface, as well as the channel-drain interface being positioned within the gate-to-drain overlap region.

SUMMARY

Embodiments of the invention are directed to a method of forming a semiconductor device. The method includes forming a channel region comprising a channel region semiconductor material having a first energy band gap characteristic. A source region is formed communicatively coupled to the channel region. A drain region is formed communicatively coupled to the channel region. A gate region is formed communicatively coupled to the channel region. An enhanced band gap region is substantially positioned at an interface between the channel region and the drain region. The enhanced band gap region includes an enhanced band gap region semiconductor material having a second band gap energy characteristic. The first energy band gap is less than the second energy band gap.

Embodiments of the invention are directed to a method of forming a semiconductor device. The method includes forming a fin, forming a source region in the fin, forming a drain region in the fin, and forming a gate region over a portion of the fin. The portion of the fin that is under the gate region defines a channel region that is between and communicatively coupled to the source region and the drain region. The channel region includes a channel region semiconductor material having a first energy band gap characteristic. An enhanced band gap region is substantially positioned at an interface between the channel region and the drain region. The enhanced band gap region includes an enhanced band gap region semiconductor material having a second band gap energy characteristic. The first energy band gap is less than the second energy band gap.

Embodiments of the invention are directed to a semiconductor device having a channel region that includes a channel region semiconductor material having a first energy band gap characteristic. A source region is communicatively coupled to the channel region. A drain region is communicatively coupled to the channel region. A gate region is communicatively coupled to the channel region. An enhanced band gap region is substantially positioned at an interface between the channel region and the drain region. The enhanced band gap region includes an enhanced band gap region semiconductor material having a second band gap energy characteristic. The first energy band gap is less than the second energy band gap.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments of the invention is particularly pointed out and distinctly claimed in the claims at the conclusion of the specification. The foregoing and other features and advantages of the embodiments are apparent from the following detailed description taken in conjunction with the accompanying drawings in which:

FIG. 2 depicts a cross-sectional view of a strained SiGe channel PFET having an enhanced band gap layer for controlling GIDL currents in accordance with embodiments of the invention, along with a diagram showing the gradient Ge % at the channel-drain interface of the strained SiGe channel PFET having the enhanced band gap layer for controlling GIDL currents in accordance with embodiments of the invention;

FIGS. 3A-12 depict the results of fabrication operations for forming the strained SiGe channel PFET shown in FIG. 2, in which:

FIG. 3A depicts a cross-sectional view, taken along the X-axis, of a semiconductor structure/device after fabrication operations according to embodiments of the invention;

FIG. 10 depicts a diagram illustrating a Ge pull-out process in accordance with embodiments of the invention;

FIG. 11A depicts a cross-sectional view, taken along the X-axis, of the semiconductor structure/device after fabrication operations according to embodiments of the invention;

FIG. 11B depicts a cross-sectional view, taken along the Z-axis and line A-A', of the semiconductor structure/device shown in FIG. 11A; and FIG. 12 depicts a cross-sectional view, taken along the X-axis, of the semiconductor structure/device after fabrication operations according to embodiments of the invention.

DETAILED DESCRIPTION

It is understood in advance that, although this detailed description includes examples of how aspects of the invention can be implemented to form fin channels from high mobility SiGe in p-type FinFET devices, implementation of the teachings recited herein are not limited to a particular type of FET structure or combination of semiconductor materials. Rather, embodiments of the present invention are capable of being implemented in conjunction with any other type of fin-based transistor device (e.g., vertical FETs) or semiconductor material, now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the fabrication of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, semiconductor devices are typically formed using active regions of a wafer. The active regions are defined by isolation regions used to separate and electrically isolate adjacent semiconductor devices. For example, in an integrated circuit having a plurality of MOSFETs, each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

Figure 1:
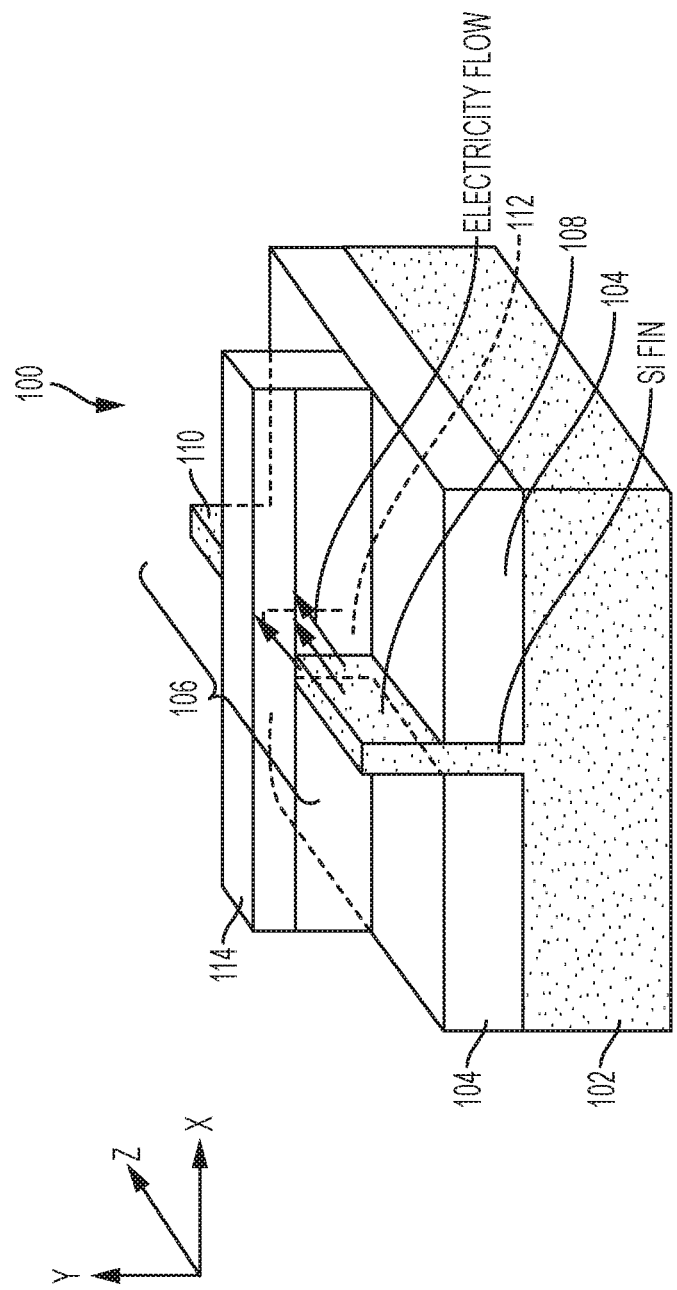
FIG. 1 depicts a three-dimensional view of an example configuration of a FinFET device capable of implementing embodiments of the invention.

A transistor type that has emerged within the MOSFET family of transistors, and which shows promise for scaling to ultra-high density and nanometer-scale channel lengths, is a so-called fin-type FET (FinFET) device. FinFETs are non-planar, three-dimensional (3D) devices that include a fin-shaped channel with a gate formed along the sidewalls and top surface of the fin channel. FIG. 1 as a three-dimensional view of a FinFET 100. The basic electrical layout and mode of operation of FinFET 100 do not differ significantly from a traditional FET. FinFET 100 includes a semiconductor substrate 102, an STI layer 104, a fin 106 and a gate 114, configured and arranged as shown. Fin 106 includes a source region 108, a drain region 110 and a channel region 112, wherein gate 114 extends over the top and sides of channel region 112. For ease of illustration, a single fin is shown in FIG. 1. In practice, FinFET devices are fabricated having multiple fins formed on STI 104 and substrate 102. Substrate 102 can be silicon, STI 104 can be an oxide (e.g., silicon oxide), and fin 106 can be silicon that has been enriched to a desired concentration level of germanium. Gate 114 controls the source to drain current flow (labeled ELECTRICITY FLOW in FIG. 1).

In contrast to planar MOSFETs, the source 108, drain 110 and channel 112 regions are built as a three-dimensional bar on top of the STI layer 104 and the semiconductor substrate 102. The three-dimensional bar is the aforementioned "fin 106," which serves as the body of the device. The gate electrode is then wrapped over the top and sides of the fin, and the portion of the fin that is under the gate electrode functions as the channel. The source and drain regions are the portions of the fin on either side of the channel that are not under the gate electrode. The dimensions of the fin establish the effective channel length for the transistor.

Forming FET channels from strained semiconductor material increases the mobility of charge carriers (i.e., electrons or holes) passing through channel's semiconductor lattice. Incorporating strain into the FET channel stretches the crystal lattice, thereby increasing charge carrier mobility in the channel so that the FET device becomes a more responsive switch. Introducing a compressive strain into a PFET transistor tends to increase hole mobility in the channel, resulting in a faster switching response to changes in voltage applied to the transistor gate. Similarly, introducing a tensile strain into an NFET transistor tends to increase electron mobility in the channel, also resulting in a faster switching response.

There are many ways to introduce tensile or compressive strain into transistors for both planar devices and FinFETs. In general, such techniques typically entail incorporating into the device epitaxial layers of one or more materials having crystal lattice dimensions or geometries that differ slightly from those of the silicon substrate. The epitaxial layers can be made of SiGe or III-V compound materials, for example. Such epitaxial layers can be incorporated into source or drain (S/D) regions, into the transistor gate that is used to modulate current flow in the channel, or into the channel itself, which is a portion of the fin. For example, one way to introduce strain into the channel is to replace bulk silicon in the channel with silicon compounds such as SiGe, for example. Because Si—Ge bonds are longer than Si—Si bonds, there is more open space in a SiGe lattice. The presence of Ge atoms having longer bonds stretches the lattice, causing internal strain. Electrons can move more freely through a lattice that contains elongated Si—Ge and Ge—Ge bonds, than through a lattice that contains shorter Si—Si bonds. Replacing Si atoms with SiGe atoms can be accomplished during a controlled process of epitaxial crystal growth, in which a new SiGe crystal layer is grown from the surface of a bulk silicon crystal, while maintaining the same crystal structure of the underlying bulk silicon crystal.

Complementary metal oxide semiconductor (CMOS) is a technology that uses complementary and symmetrical pairs of p-type and n-type MOSFETs to implement logic functions. A promising dual channel CMOS integration schemes for future FET fabrication technologies is to use tensile-strained Si for NFETs and compressively-strained $Si_{1-x}Ge_x$ grown on a Si substrate for PFETs. The compressive strain (typically expressed as a percentage) introduced by using SiGe in the active/channel region of a semiconductor device is based on the concentration of Ge introduced into the Si. For example, a SiGe channel fin having a 25% concentration of Ge can exhibit a nominal compressive strain of 0.01 (or 1%) with a +/−2% variation. To achieve high performance and better reliability in PFET devices, a high Ge content (e.g., Ge % ≥about 40%) strained $Si_{1-x}Ge_x$ channel is required. To reduce S/D contact resistance, the S/D regions are highly doped, strained SiGe with a higher Ge % (e.g., Ge % ≥about 65%). The S/D Ge % can be selected to maximize the dopant solubility in the SiGe S/D region. For example, if the dopant is boron (B), it is generally accepted that a Ge % that can maximize the B solubility in the strained SiGe S/D region is a Ge % ≥about 65%.

However, providing a SiGe channel in conjunction with high Ge % SiGe S/D regions result in undesirably high GIDL currents, which are primarily due to the narrow band gap of the high Ge % SiGe channel region. In general, MOSFETs that operate above 1.1V (band gap of Si) and have thin gate dielectrics can suffer from GIDL. Additionally, heavily doped extension regions in combination with thinner high-k gate dielectrics create high gate-induced E-fields at the gate-drain overlap region. This high field results in band-to-band tunneling, which further contributes to GIDL current. Accordingly, there is a need for forming FET devices having reduced GIDL current while maintaining the performance benefits (e.g., strain benefits and improved contact resistance levels) that result from having strained SiGe channel and S/D regions.

Turning now to an overview of aspects of the present invention, embodiments of the invention provide improved fabrication methods and resulting structures for reducing GIDL currents by forming an enhanced band gap layer that is substantially positioned at the channel-drain interface of an FET, wherein the enhanced band gap layer is formed from a material having a larger band gap than the FET's channel region. In embodiments of the invention, the enhanced band gap layer is substantially positioned at the channel-drain interface using a process referred to herein as an "element pull-out" process. In embodiments of the invention, the element is Ge so the process is also referred to herein as a "germanium pull-out" process. In embodiments of the invention, the FET is a FinFET, the fin is formed from strained $Si_{1-x}Ge_x$, a central portion of the $Si_{1-x}Ge_x$ fin is the channel, and a portion of the $Si_{1-x}Ge_x$ fin that is adjacent the fin channel is the drain. The Ge % in the $Si_{1-x}Ge_x$ channel can be selected to provide high performance and reliability in the final FinFET structure. In a non-limiting example, a Ge % of about 40% in the $Si_{1-x}Ge_x$ channel can achieve certain high performance and reliability targets.

In accordance with aspects of the invention, the outer walls of a portion of the SiGe 40% channel fin are exposed at the channel-drain interface. The notation "SiGe 40%" indicates that the SiGe material contains 40% Ge and 60% Si. The exposed channel fin walls define an area of the SiGe 40% channel fin that will, after completion of the element pull-out process, become the enhanced band gap layer substantially positioned at the channel-drain interface. A sacrificial atom-donor layer is formed over the exposed channel fin walls. In accordance with aspects of the invention, the atom-donor layer is formed from a material that can donate certain of its component atoms under thermal influence. In embodiments of the invention wherein the channel fin is SiGe 40% channel fin, the sacrificial atom-donor layer can be a $SiGeO_x$ material that is formed from a combination of silicon oxide ($SiO_x$) and germanium oxide ($GeO_x$), wherein x can be between about 1.5 and about 2. In some embodiments of the invention, x can be between about 1.9 and about 2. For example, where x=2, the sacrificial atom-donor layer can be $SiGeO_2$ formed from a combination of $SiO_2+GeO_2$. In accordance with aspects of the invention, an anneal is applied (e.g., a spike anneal between about 970 Celsius and about 1077 Celsius) that raises the temperature of the $SiGeO_x$ material and the underlying SiGe 40% channel fin to about the melting point of Ge. In embodiments of the invention, at least one anneal is performed in an inert gas environment, and the inert gas can include nitrogen, argon, helium, and neon. As the temperature of the Ge atoms increases, the Ge atoms begin to vibrate. As the temperature of the Ge atoms approach the melting point of Ge, the Ge atoms nearest the surface vibrate enough to break the bonds that hold the Ge atoms in the underlying SiGe 40% region and the $SiGeO_x$ material, thereby extracting Ge from the underlying SiGe 40% region, and also extracting $GeO_x$ from the $SiGeO_x$ material. In embodiments where the $SiGeO_x$ material is $SiGeO_2$, the extracted Ge and $GeO_2$ react to form 2GeO, which is a volatile product that can be removed by evaporation, for example.

Extracting Ge atoms from the surface of the underlying SiGe 40% region reduces the Ge concentration in a surface layer of the underlying SiGe 40% region. As the $Ge+GeO_2=2GeO$ reaction proceeds, the reduced Ge concentration layer grows, thereby moving from the outer surfaces of the underlying SiGe 40% region and converging toward the center of the underlying SiGe 40% region. As the Ge concentration of the layer is reduced, the Si concentration increases, thereby increasing the band gap of the reduced Ge concentration layer. The final Si and Ge concentrations in the reduced Ge concentration layer are controlled according to a number of parameters (e.g., anneal temperature, anneal duration, thickness of the atom-donor layer, starting Ge % in the SiGe channel fin, etc.) to achieve a desired difference between the band gap of the SiGe fin channel region and the band gap of the enhanced band gap layer. In embodiments of the invention, the desired band gap difference is sufficient to maintain GIDL currents below a predetermined level. In the embodiments of the invention illustrated herein, the Ge % (about 20%) in the enhanced band gap layer is approximately ½ of the Ge % (about 40%) in the channel fin at the channel-drain interface.

Similarly, extracting $GeO_2$ from the surface of the $SiGeO_2$ material removes $GeO_2$ at a surface layer of the $SiGeO_2$ material, thereby converting the surface layer of the $SiGeO_2$ material to a surface layer of $SiO_2$. As the $Ge+GeO_2=2GeO$ reaction proceeds, the $SiO_2$ layer grows and moves from the outer surfaces through the $SiGeO_2$ material. At the end of the $Ge+GeO_2=2GeO$ reaction, a hydrofluoric acid etchant that is selective to oxide materials, for example, can be used to remove the $SiO_2$ converted portions of the atom-donor layer, along with any remaining unreacted $SiGeO2$ portions of the atom-donor layer.

The pull-out process in accordance with aspects of the invention is well-controlled, as the reaction of extracted Ge with extracted $GeO_2$ only occurs during the spike anneal. The selective Ge and $GeO_2$ extractions are therefore self-limited and will continue until either all of the $SiGeO_2$ is converted to $SiO_2$ or until all of the Ge has been removed from the SiGe enhanced band gap layer, in which case the reaction ($Ge+GeO_2=2GeO$) cannot proceed.

Turning now to a more detailed description of aspects of the invention, FIG. 2 depicts a cross-sectional view of a semiconductor structure 200 formed as a p-type FinFET structure, along with a diagram 202 that plots the Ge % gradient that results in the channel fin 312 of the semiconductor structure 200 in accordance with aspects of the invention. Although the structure 200 shown in FIG. 2 is a two-dimensional cross-sectional depiction, it is understood that the semiconductor structure 200 has many of the same three-dimensional features as the three-dimensional view of the FinFET device 100 shown in FIG. 1. More specifically, the cross-sectional view of the semiconductor device 200 is looking along the X-axis of the X/Y/Z axes shown in FIGS. 1 and 2. The semiconductor structure 200 includes a substrate 302, a shallow trench isolation (STI) region 320, a upper (or channel) fin 312, a source region 502, a drain region 504, an interlayer dielectric (ILD) region 602, a metal gate 1202, a gate dielectric 1204, dummy oxide regions 402, gate spacers 414, and a cap layer 702, configured and arranged as shown. The substrate 302 can be made of any suitable substrate material, such as, for example, monocrystalline Si, SiGe, SiC, III-V compound semiconductor, II-VI compound semiconductor, or semiconductor-on-insulator (SOI). The gate 1202 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials.

The gate dielectric 1204 can include interfacial layers (IL) and high-k dielectric layers. In some embodiments of the invention, the high-k dielectric layers can modify the work function of the gate 1202. The high-k dielectric layer can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum.

In some embodiments of the invention, work function layers (not depicted) are formed between the gate dielectric 1204 and the conductive gate 1202. The work function layers can be made of work function materials, such as, for example, aluminum, lanthanum oxide, magnesium oxide, strontium titanate, strontium oxide, titanium nitride, titanium aluminum nitride, titanium aluminum carbide, tantalum nitride, and combinations thereof. In some embodiments of the invention, the work function layers further modify the work function of the gate 1202.

The semiconductor structure 200 operates in a similar fashion as the FinFET 100 (shown in FIG. 1) except the channel fin 312 is compressively-strained $Si_{1-x}Ge_x$ grown on the substrate 302. To achieve high performance and better reliability in the semiconductor structure 200, the channel fin 312 is a high Ge content (e.g., Ge % ≥about 40%) strained $Si_{1-x}Ge_x$ material. To reduce S/D contact resistance, the S/D regions 502, 504 are highly doped, strained SiGe with a higher Ge % (e.g., Ge % ≥about 65%). The Ge % in the S/D regions 502, 504 can be selected to maximize the dopant solubility in the SiGe S/D regions 502, 504. In the example depicted in FIG. 2, the dopant is boron (B). It is generally accepted that a Ge % that can maximize B solubility in the strained SiGe S/D region is a Ge % ≥about 65%.

As previously noted herein, in known FET architectures, proving a SiGe channel in conjunction with high Ge % SiGe S/D regions result in undesirably high GIDL currents, which are primarily due to the narrow band gap of the high Ge % SiGe channel region. In accordance with embodiments of the invention, in order to reduce such GIDL currents, an enhanced band gap layer 1002 is formed substantially at the channel-drain interface of the semiconductor structure 200, wherein the enhanced band gap layer 1002 is formed from a material having a larger band gap than the channel fin region 312. In embodiments of the invention, the enhanced band gap layer 1002 is formed substantially at the channel-drain interface using a process referred to herein as an "element pull-out" process. In embodiments of the invention, the element is Ge so the process is also referred to herein as a "germanium pull-out" process. The germanium pull-out process described herein is used to form the enhanced band gap layer 1002 by reducing the Ge concentration in the enhanced band gap layer 1002 such that it is below the Ge concentration in the SiGe 40% channel fin 312. As the Ge concentration of the enhanced band gap layer 1002 is reduced below SiGe 40%, the Si concentration of the enhanced band gap layer 1002 increases, thereby increasing the band gap of the enhanced band gap layer 312 in comparison with the band gap of the SiGe 40% channel fin 312. An example of this is shown by the diagram 202 shown in FIG. 2. The final Si and Ge concentrations in the enhanced band gap layer 1002 are controlled according to a number of parameters to achieve a desired difference between the band gap of the SiGe channel fin 312 and the band gap of the enhanced band gap layer 1002. In embodiments of the invention, the desired band gap difference is sufficient to maintain GIDL currents below a predetermined level. In the embodiment of the invention illustrated herein (e.g., diagram 202 shown in FIG. 2), the Ge % (about 20%) in the enhanced band gap layer is approximately ½ of the Ge % (about 40%) in the SiGe 40% channel fin 312.

An example fabrication method for forming the semiconductor structure 200 using a germanium pull-out process in accordance with aspects of the invention is depicted in FIGS. 3A to 12. In accordance with aspects of the invention, the fabrication operations that are applied to the semiconductor structure 200A depicted in FIGS. 3A to 12 will result in the final semiconductor structure 200 shown in FIG. 2.

Figure 3B:
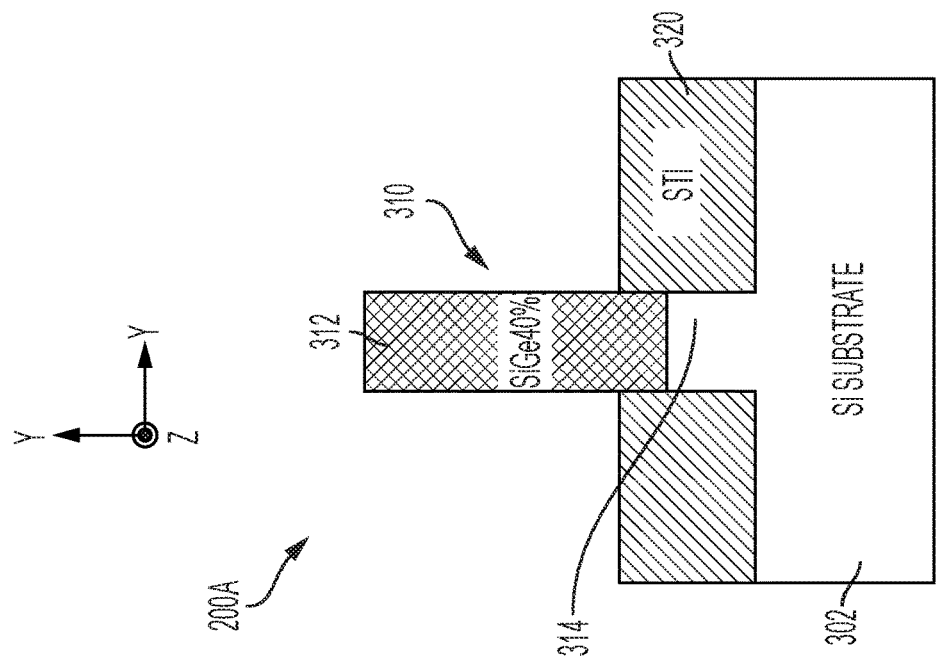
FIG. 3B depicts a cross-sectional view, taken along the Z-axis, of the semiconductor structure/device shown in FIG. 3A.
Figure 3A:
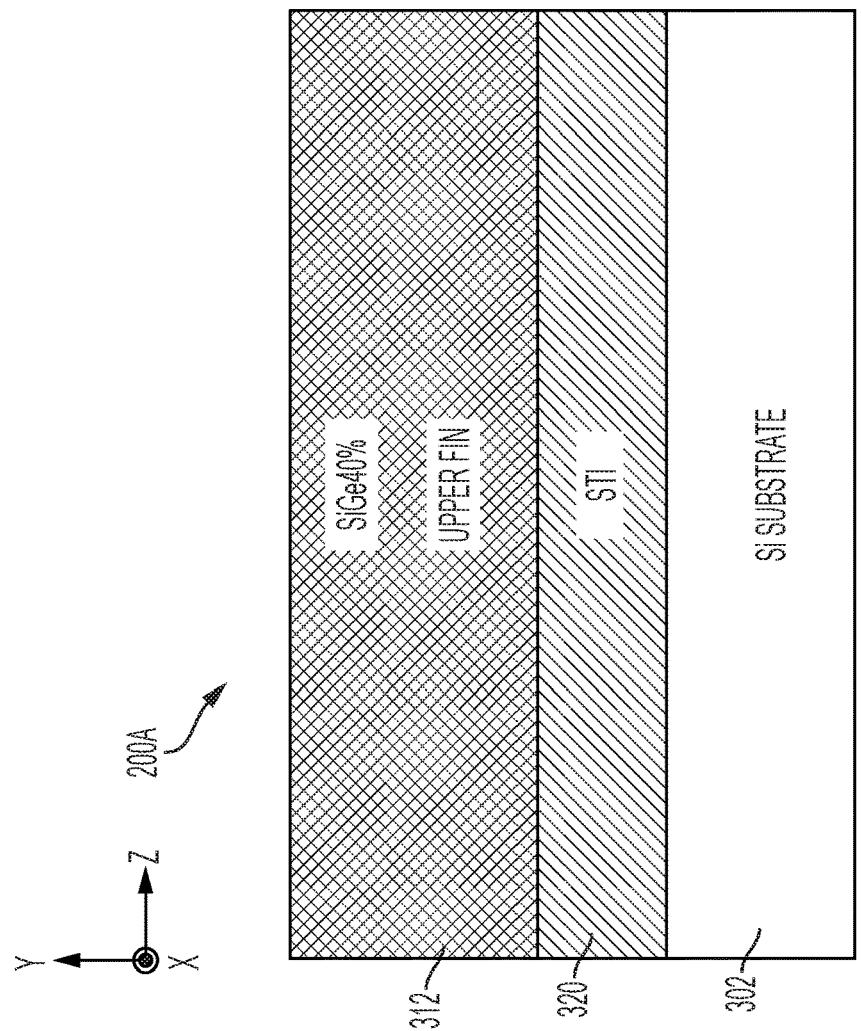

Turning now to FIGS. 3A and 3B, FIG. 3A depicts a cross-sectional view of a semiconductor structure/device 200A taken along the X-axis after fabrication operations according to embodiments of the invention, and FIG. 3B depicts a cross-sectional view of the semiconductor structure/device 200A of FIG. 3A taken along the Z-axis. As best shown in FIG. 3B, known fabrication operations have been used to form the semiconductor structure 200A having a substrate 302, STI regions 320, and a fin 310, configured and arranged as shown. The fin 310 includes a lower fin 314 formed from the same material (e.g., Si) as the substrate 302, along with an upper fine 312 formed from compressively-strained $Si_{1-x}Ge_x$. To achieve high performance and better reliability in the semiconductor structure 200A, the channel fin 312 is a high Ge content (e.g., Ge % ≥about 40%) strained $Si_{1-x}Ge_x$ material.

In some embodiments of the invention, the semiconductor structure 200A shown in FIGS. 3A and 3B can be fabricated by patterning and etching the substrate 302 to form thereon an initial high aspect ratio (taller than wide) fin structure (not shown). A dielectric material (e.g., $SiO_2$) can be deposited around the initial fin structure then planarized to the height of the initial fin. A portion of the initial fin can be removed such that a trench is formed in the dielectric material. The remaining portion of the initial fin is the lower fin 314. The initial fin can be removed/etched using any process (e.g., wet or dry etching) that removes material. In embodiments of the invention where the initial fin is Si, the initial fin can be etched using a wet etch formed from KOH. The upper fin 312 can be formed by epitaxially growing SiGe (e.g., SiGe 40%) from the Si lower fin 314. Depending on the required height of the SiGe upper fin 312, as well as the lattice constant mismatch (e.g., about 3%) between Si and SiGe, defects can be present in the SiGe upper fin 312. However, because the SiGe upper fin 312 is grown within the trench formed in the dielectric material, these defects are substantially confined at a lower region of the SiGe upper fin 312.

In some embodiments of the invention, the semiconductor structure 200A shown in FIGS. 3A and 3B can be fabricated by patterning and recessing a selected portion of the substrate 302. In this example, the substrate 302 is Si. SiGe is epitaxially grown over the Si substrate 302 followed by a fin pattern and RIE to form the SiGe upper fin 312 and the Si lower fin 314.

As noted above, in embodiments of the invention, the SiGe upper fin 312 can be grown epitaxially from the Si lower fin 314. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) can be doped during deposition (in-situ doped) by adding dopants, n-type dopants (e.g., phosphorus or arsenic) or p-type dopants (e.g., boron or gallium), depending on the type of transistor.

The phrases "epitaxial growth and/or deposition" and "epitaxially formed and/or grown" mean the growth of a semiconductor material (crystalline material) on a deposition surface of another semiconductor material (crystalline material) in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a <100> orientated crystalline surface will take on a <100> orientation. In some embodiments of the invention, epitaxial growth and/or deposition processes are selective to forming on semiconductor surface, and generally do not deposit material on exposed surfaces, such as silicon dioxide or silicon nitride surfaces.

In some embodiments of the invention, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

After epitaxially growing the SiGe upper fin 312 from the Si lower fin 314, the dielectric material is recessed to form the STI regions 320, which prevent electrical current leak between adjacent semiconductor device components. The STI region 320 can be of any suitable dielectric material, such as, for example, an oxide such as $SiO_2$.

Figure 4B:
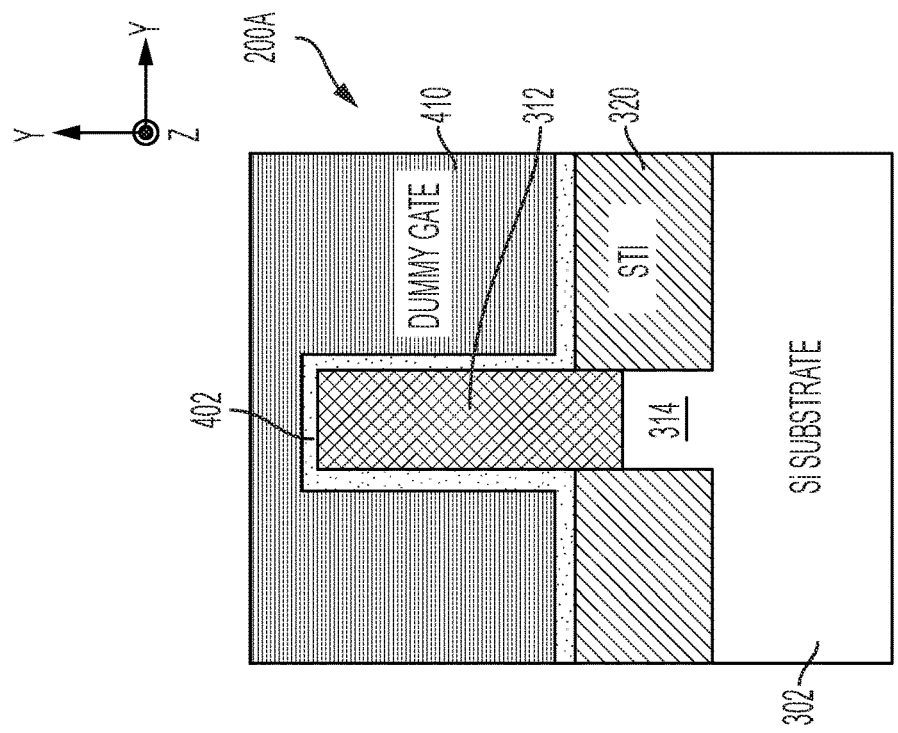
FIG. 4B depicts a cross-sectional view, taken along the Z-axis, of the semiconductor structure/device shown in FIG. 4A.
Figure 4A:
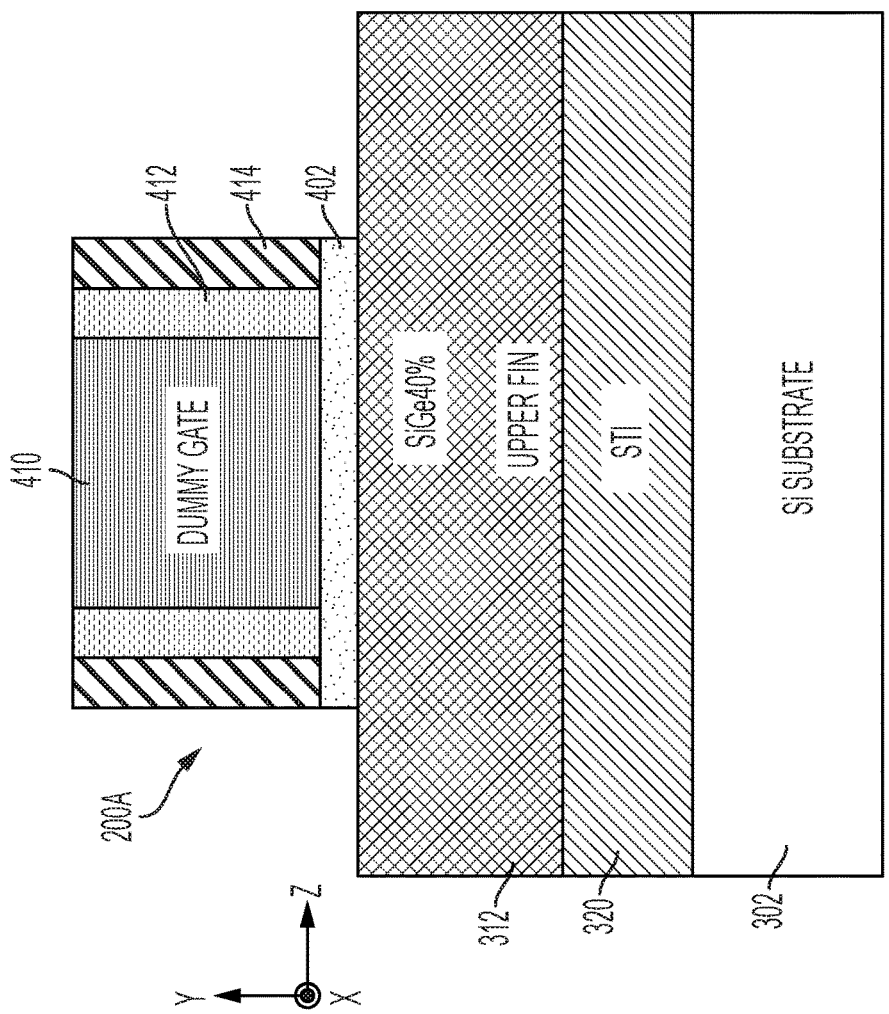
FIG. 4A depicts a cross-sectional view, taken along the X-axis, of the semiconductor structure/device after fabrication operations according to embodiments of the invention.

In FIGS. 4A and 4B, known fabrication operations have been used to form a dummy oxide (e.g., $SiO_2$) 402, a dummy gate (e.g., amorphous silicon (a-Si)) 410, a first spacer (e.g., SiN) 412, and a second spacer (e.g., silicoboron carbonitride (SiBCN)) 414 over and around the upper fin 312 in a region of the fin 310 (shown in FIG. 3B) that will form the channel region. For example, a layer of the $SiO_2$ is deposited conformally over the upper fin 312, and a layer of a-Si is deposited over the $SiO_2$ layer. The a-Si is patterned and etched to form the dummy gate 410 using, for example, a dry etch, or a combination of sequential dry and wet etches. The first spacer 412 is formed on sidewalls of the dummy gate 410, and the second spacer 414 is formed on sidewalls of the first spacer 412. The first and second spacers 412, 414 can be formed using a CVD, PECVD, ALD, PVD, chemical solution deposition, or other like process in combination with a wet or dry etch process. In accordance with aspects of the invention, the first spacer 414 at the channel-drain interface marks (or defines) an area of the upper fin 312 that will be converted, using the herein described germanium pull-out process, to form an enhanced band gap region 1002 (shown in FIGS. 2, 11A, and 11B). In accordance with aspects of the invention, the first spacer 412 and the second spacer 414 are formed from materials that have sufficiently different etch selectivity that will allow the first spacer 412 to be removed while leaving the second spacer 414 intact. In embodiments of the invention, the first spacer 412 is SiN, and the second spacer 414 is SiBCN. After the first and second spacers 412, 414 have been formed, the portions of the layer of $SiO_2$ that are not under the dummy gate 410, the first spacer 412, and the second spacer 414 are removed using any suitable removal process to form the dummy oxide 402.

Figure 5B:
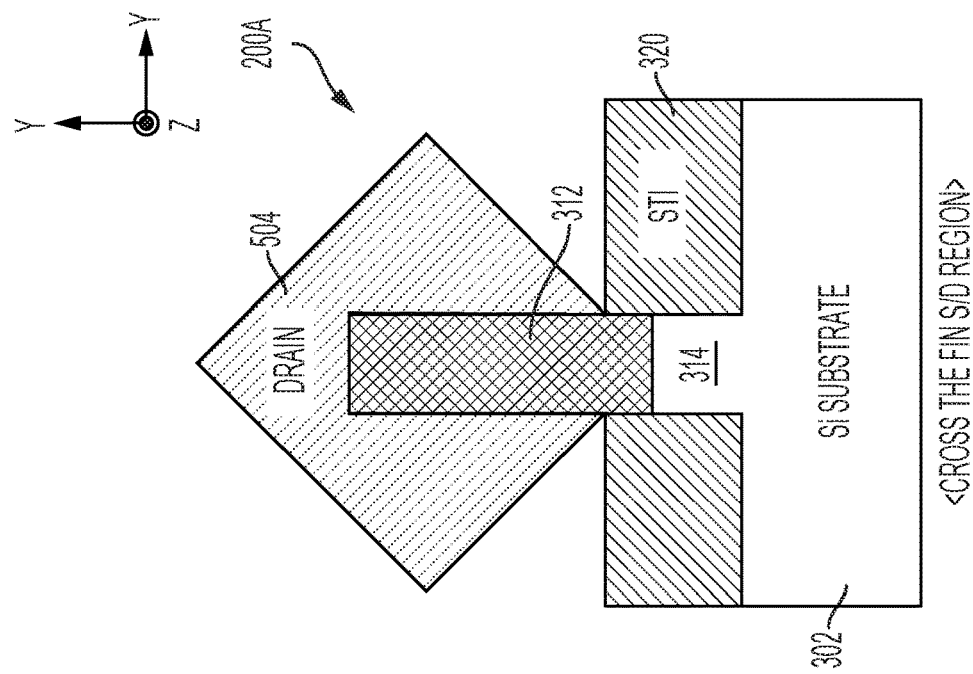
FIG. 5B depicts a cross-sectional view, taken along the Z-axis, of the semiconductor structure/device shown in FIG. 5A.
Figure 5A:
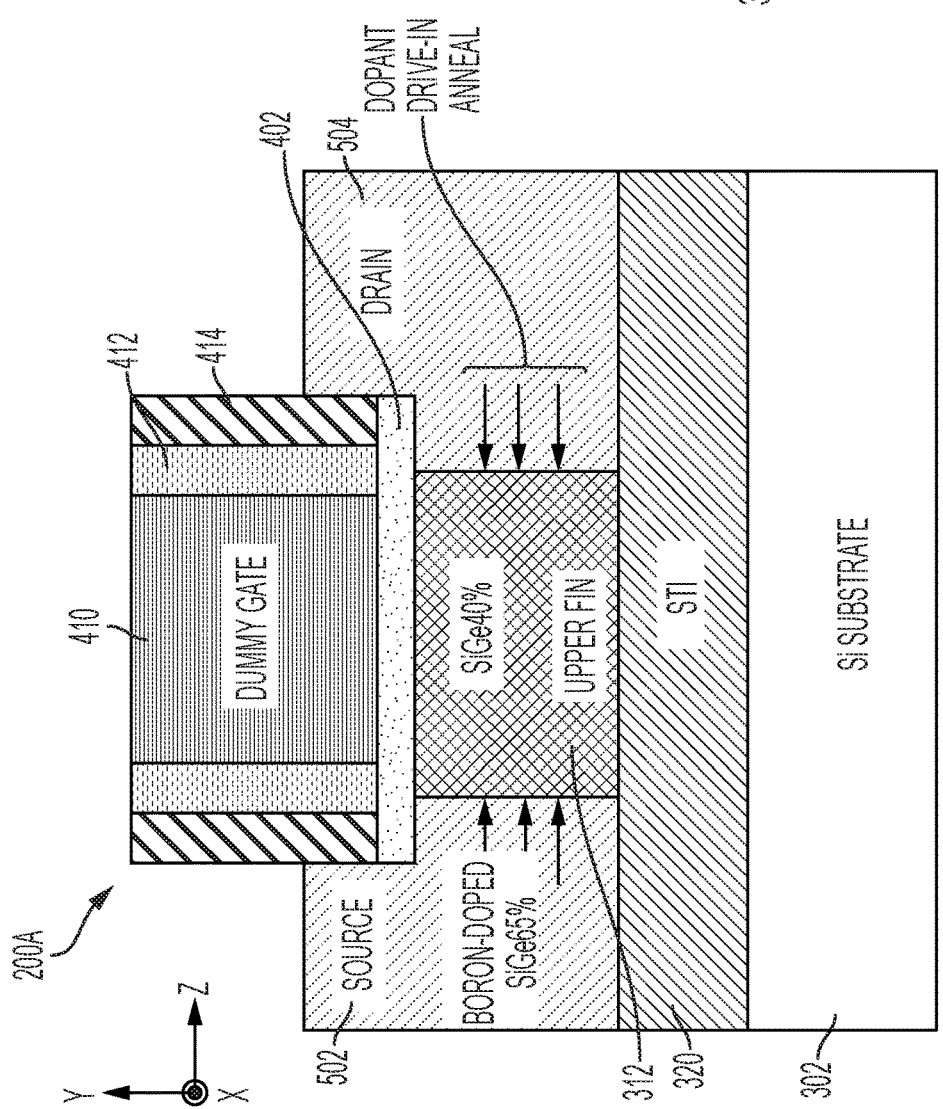
FIG. 5A depicts a cross-sectional view, taken along the X-axis, of the semiconductor structure/device after fabrication operations according to embodiments of the invention.

In FIGS. 5A and 5B, known fabrication operations have been used to form a doped $Si_{1-x}Ge_x$ source region 502 and a doped $Si_{1-x}Ge_x$ drain region 504 on the SiGe 40% upper fin 312 at opposite ends of the dummy gate 410. The doped source and drain regions 502, 504 can be formed by a variety of methods, such as, for example, in-situ doped epitaxy, doping following the epitaxy, implantation and plasma doping, ultrahigh vacuum chemical vapor deposition (UHVCVD), rapid thermal chemical vapor deposition (RTCVD), metal organic chemical vapor deposition (MOCVD), low-pressure chemical vapor deposition (LP-CVD), limited reaction processing CVD (LRPCVD), and MBE. In some embodiments of the invention, the $Si_{1-x}Ge_x$ doped source and drain regions 502, 504 can be doped during deposition (in-situ doped) by adding dopants, n-type dopants (e.g., phosphorus or arsenic) or p-type dopants (e.g., Ga, B, $BF_2$, or Al). Because the final semiconductor device 200 (shown in FIG. 2) is a PFET, the $Si_{1-x}Ge_x$ source region 502 and the $Si_{1-x}Ge_x$ drain region 504 are doped with p-type B. The dopant concentration in the $Si_{1-x}Ge_x$ source region 502 and the $Si_{1-x}Ge_x$ drain region 504 can range from $1 \times 10^{19}$ $cm^{-3}$ to $2 \times 10^{21}$ $cm^{-3}$, or between $1 \times 10^{20}$ $cm^{-3}$ and $1 \times 10^{21}$ $cm^{-3}$. To reduce S/D contact resistance, the $Si_{1-x}Ge_x$ source and drain regions 502, 504 are highly doped and have a higher Ge % (e.g., Ge % ≥about 65%). The Ge % in the $Si_{1-x}Ge_x$ source and drain regions 502, 504 can be selected to maximize the dopant solubility in the $Si_{1-x}Ge_x$ source and drain regions 502, 504. For example, it is generally accepted that a Ge % that can maximize the B solubility in the $Si_{1-x}Ge_x$ source and drain regions 502, 504 is a Ge % ≥about 65%. A dopant drive-in anneal (e.g., a rapid thermal anneal (RTA) is performed to activate and drive in the implanted B dopants. In accordance with aspects of the invention, the dopant drive-in anneal is controlled to position the interface between the channel fin 312 and the doped source region 504 beneath the first spacer 412.

Figure 6B:
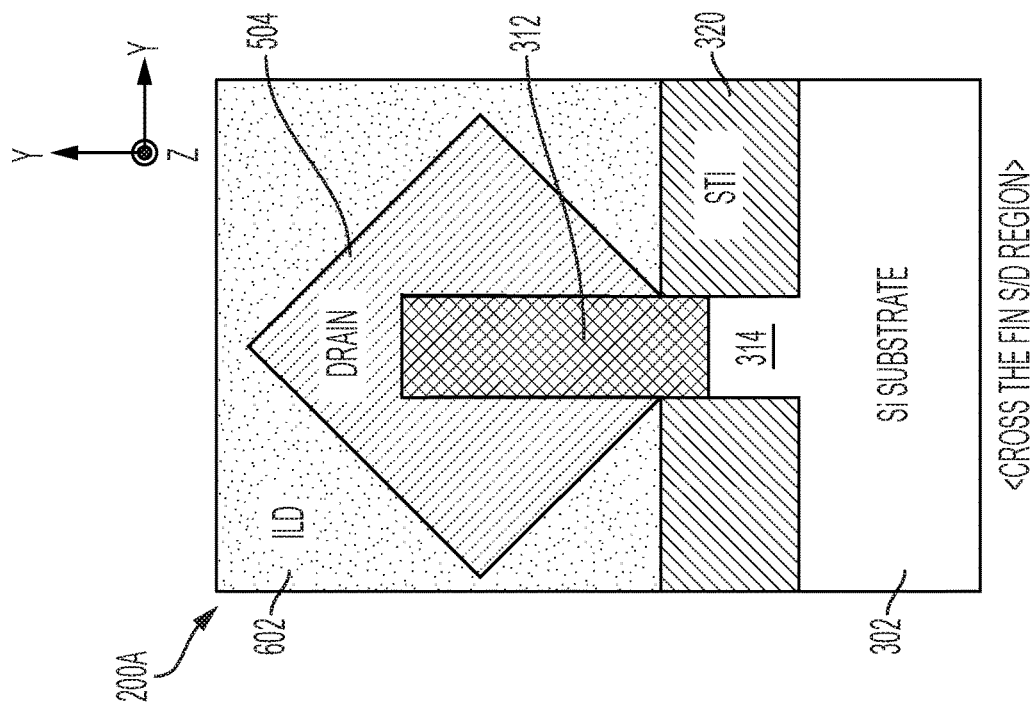
FIG. 6B depicts a cross-sectional view, taken along the Z-axis, of the semiconductor structure/device shown in FIG. 6A.
Figure 6A:
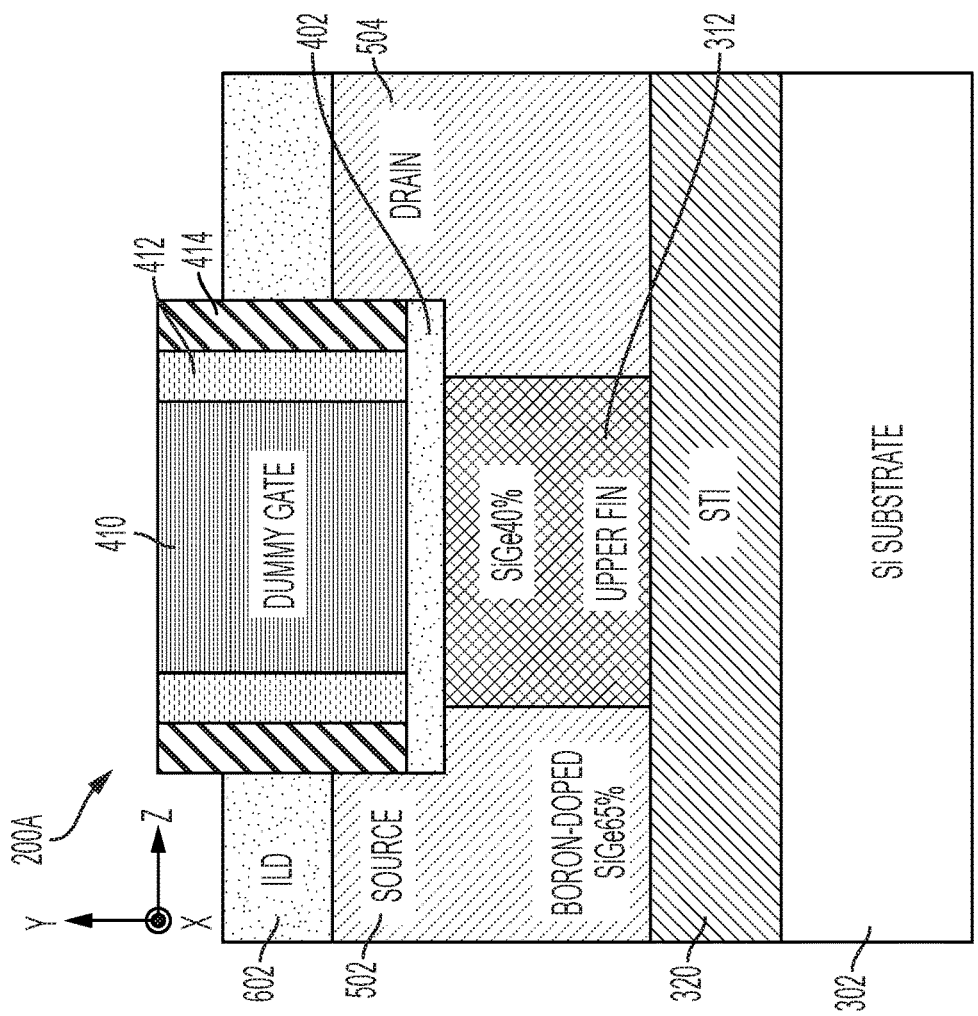
FIG. 6A depicts a cross-sectional view, taken along the X-axis, of the semiconductor structure/device after fabrication operations according to embodiments of the invention.

In FIGS. 6A and 6B, known fabrication operations have been used to form an interlayer dielectric (ILD) layer 602, configured and arranged as shown. The ILD 602 can be made of any suitable dielectric material, such as, for example, porous silicates, carbon doped oxides, silicon dioxide, silicon nitrides, silicon oxynitrides, or other dielectric materials. Any known manner of forming the ILD 602 can be utilized. The ILD 602 can be formed using, for example, CVD, PECVD, ALD, flowable CVD (flowable oxide), spin-on dielectrics, or PVD. The ILD 602 is recessed below the dummy gate 410 using any suitable techniques, such as, for example, an oxide recess.

Figure 7B:
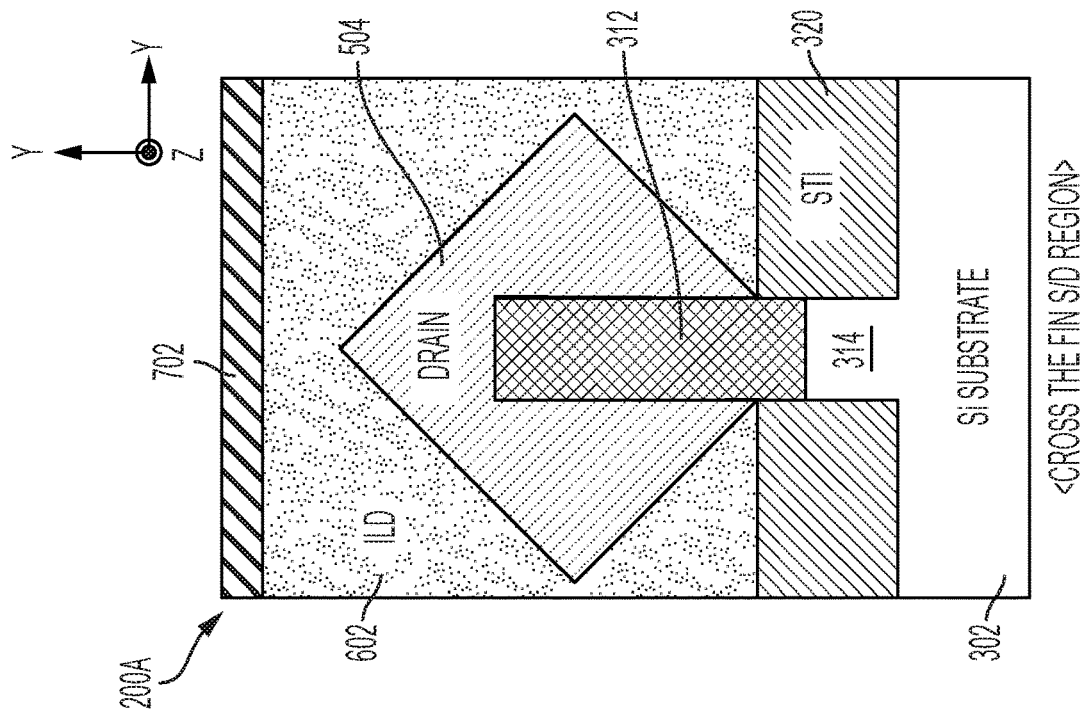
FIG. 7B depicts a cross-sectional view, taken along the Z-axis, of the semiconductor structure/device shown in FIG. 7A.
Figure 7A:
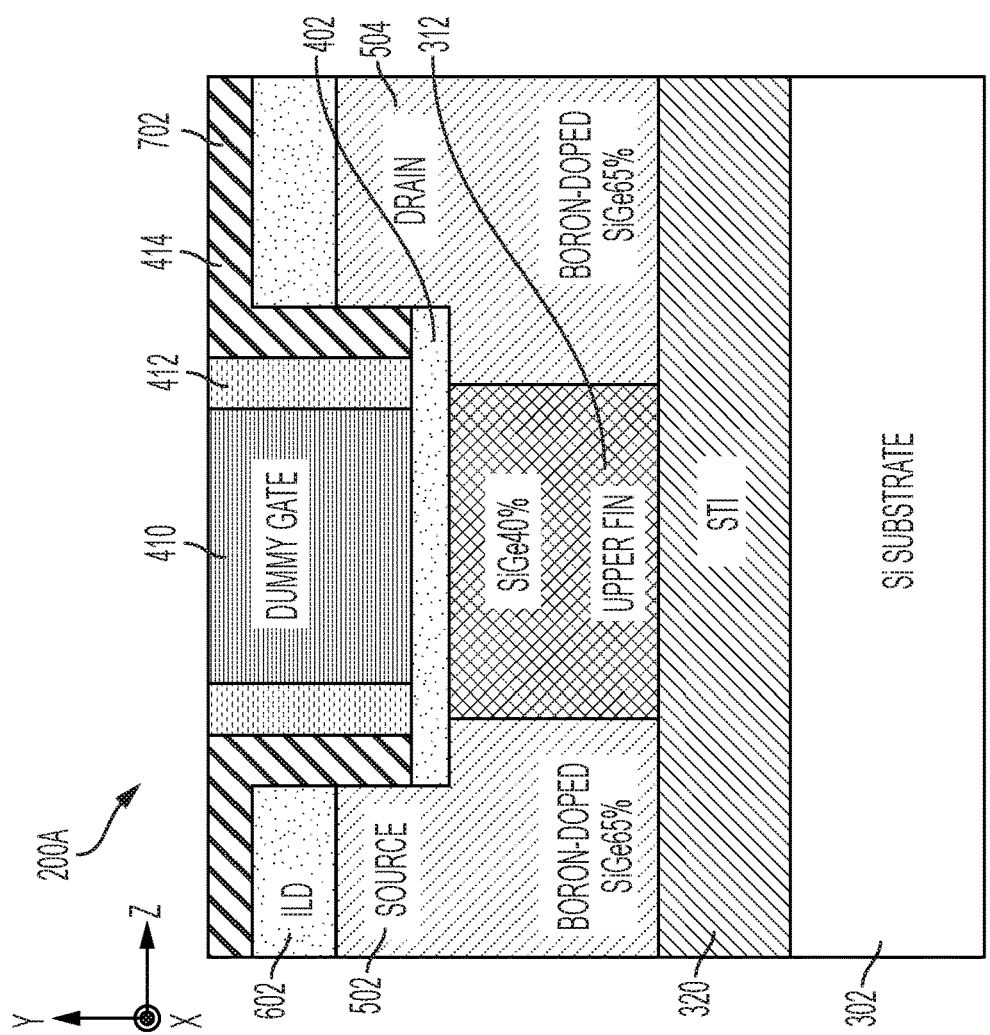
FIG. 7A depicts a cross-sectional view, taken along the X-axis, of the semiconductor structure/device after fabrication operations according to embodiments of the invention.

In FIGS. 7A and 7B, known fabrication operations have been used to form and planarize a capping layer 702 on the ILD 602. In some embodiments of the invention, the capping layer 702 is formed using a CVD, PECVD, ALD, PVD, chemical solution deposition, or other like process. The capping layer 702 can be made of any suitable material including, for example, a nitride, SiN, or SiBCN.

Figures 8A, 8B:
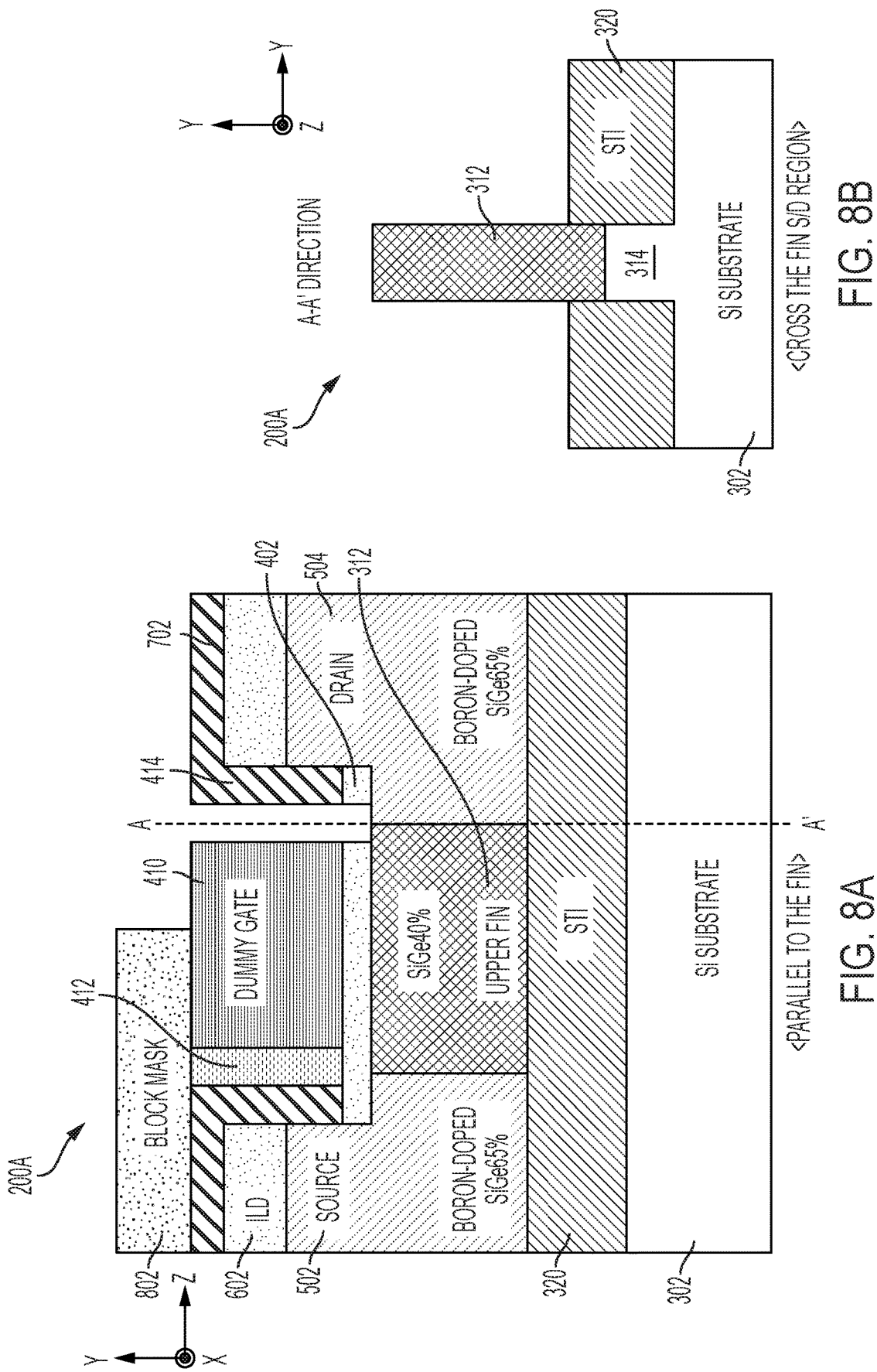
FIG. 8A depicts a cross-sectional view, taken along the X-axis, of the semiconductor structure/device after fabrication operations according to embodiments of the invention.
FIG. 8B depicts a cross-sectional view, taken along the Z-axis and line A-A', of the semiconductor structure/device shown in FIG. 8A.

In FIGS. 8A and 8B, known fabrication operations have been used to form a blocking mask 802 over the first spacer 412, which is over the interface between the channel fin 312 and the doped source region 502. In embodiments of the invention, the blocking mask 802 can be an organic planarization layer (OPL). In general, OPLs are used as etch masks for pattern transfers into inorganic substrates, to fill pre-existing features, and to planarize the substrate to allow for larger patterning process windows. After the blocking mask 802 is formed, known fabrication operations have been used to selectively remove the first spacer 412 and a portion of the dummy oxide 402 substantially at the channel-drain interface between the channel fin 312 and the doped drain region 504. In accordance with aspects of the invention, the first spacer 414 at the channel-drain interface marks (or defines) an area of the channel fin 312 that will be converted, using the herein described germanium pull-out process, to form the enhanced band gap region 1002 (shown in FIGS. 2, 11A, and 11B). In accordance with aspects of the invention, the first spacer 412, the second spacer 414, and the capping layer 702 are formed from materials that have sufficiently different etch selectivity that will allow the first spacer 412 to be removed while leaving the second spacer 414 and the capping layer 702 substantially intact. In embodiments of the invention, the first spacer 412 is SiN, the second spacer 414 is SiBCN, and the capping layer 702 is SiBCN.

Figure 9B:
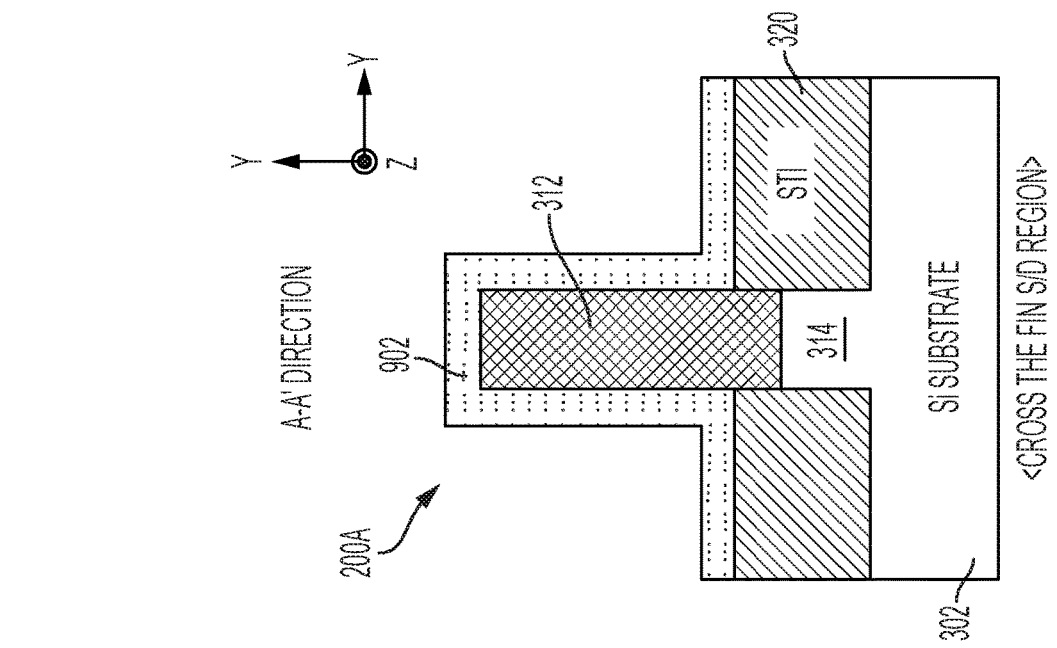
FIG. 9B depicts a cross-sectional view, taken along the Z-axis and line A-A', of the semiconductor structure/device shown in FIG. 9A.
Figure 9A:
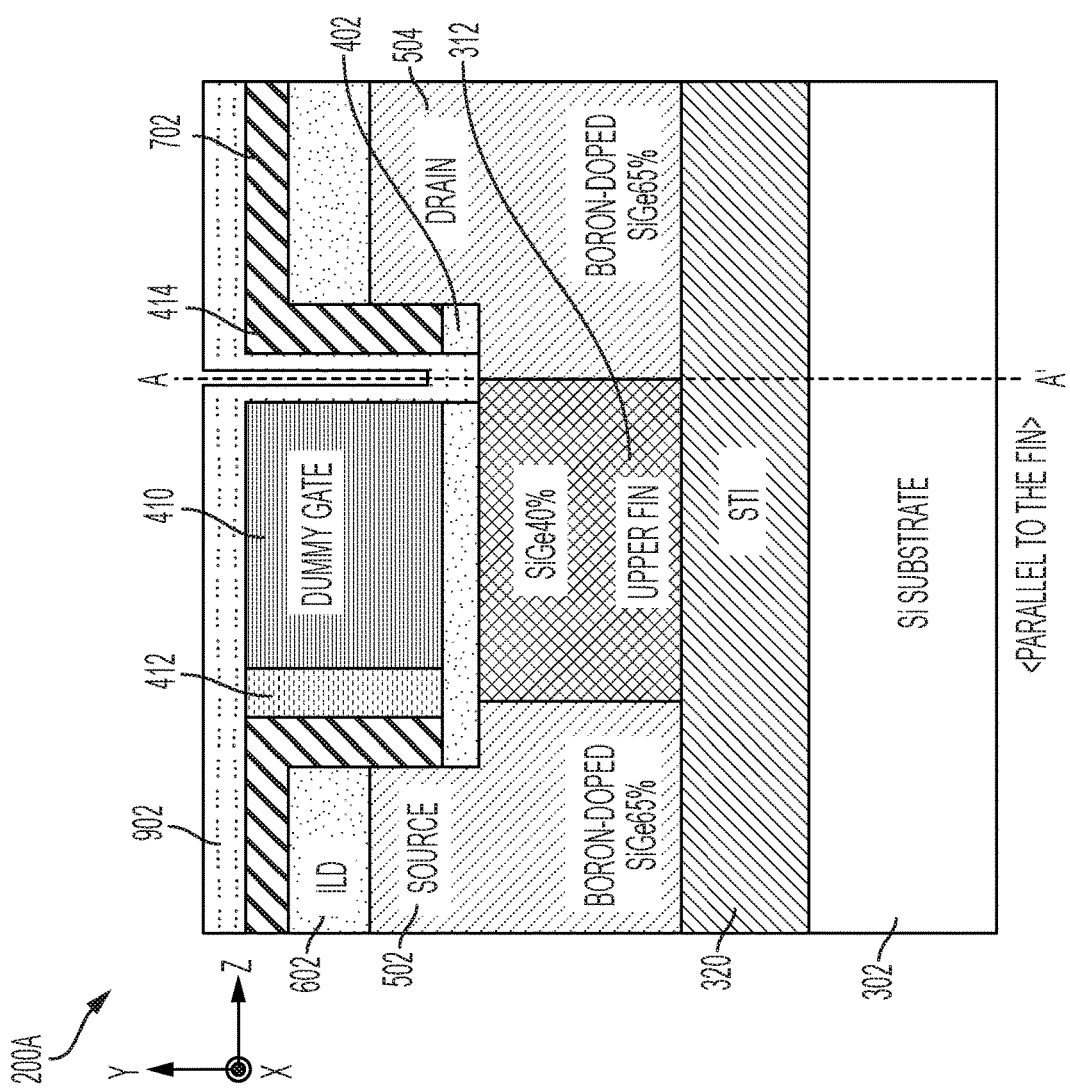
FIG. 9A depicts a cross-sectional view, taken along the X-axis, of the semiconductor structure/device after fabrication operations according to embodiments of the invention.

In FIGS. 9A and 9B, known fabrication operations have been used to remove the blocking mask 802 (shown in FIGS. 8A and 8B). After removal of the first spacer 412 at the channel-drain interface, outer walls of a portion of the SiGe 40% channel fin 312 are exposed substantially at the channel-drain interface. The exposed walls of the channel fin 312 define an area of the SiGe 40% channel fin 312 that will, after completion of the element pull-out process, become the enhanced band gap layer 1002 (shown in FIGS. 2, 11A, and 11B). A sacrificial atom-donor layer 902 is conformally deposited such that it lines the inner walls of the space that was occupied by the first spacer 412 at the channel-drain interface. In accordance with aspects of the invention, the atom-donor layer 902 is formed from a material that can donate certain of its component atoms under thermal influence. In embodiments of the invention wherein the channel fin 312 is SiGe 40%, the sacrificial atom-donor layer 902 can be a $SiGeO_x$ material that is formed from a combination of silicon oxide ($SiO_x$) and germanium oxide ($GeO_x$).

Figure 10:
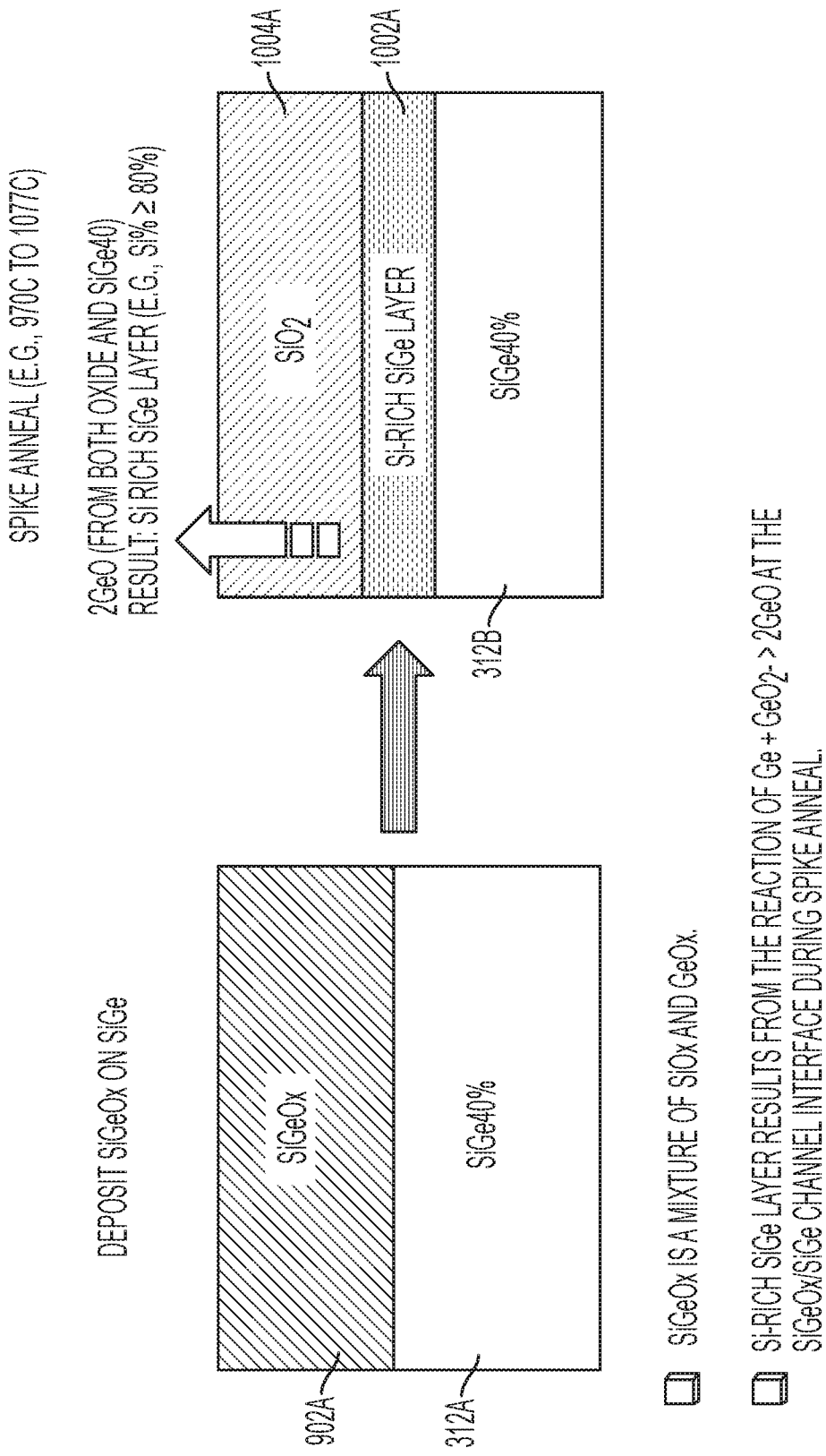
Figure 11:
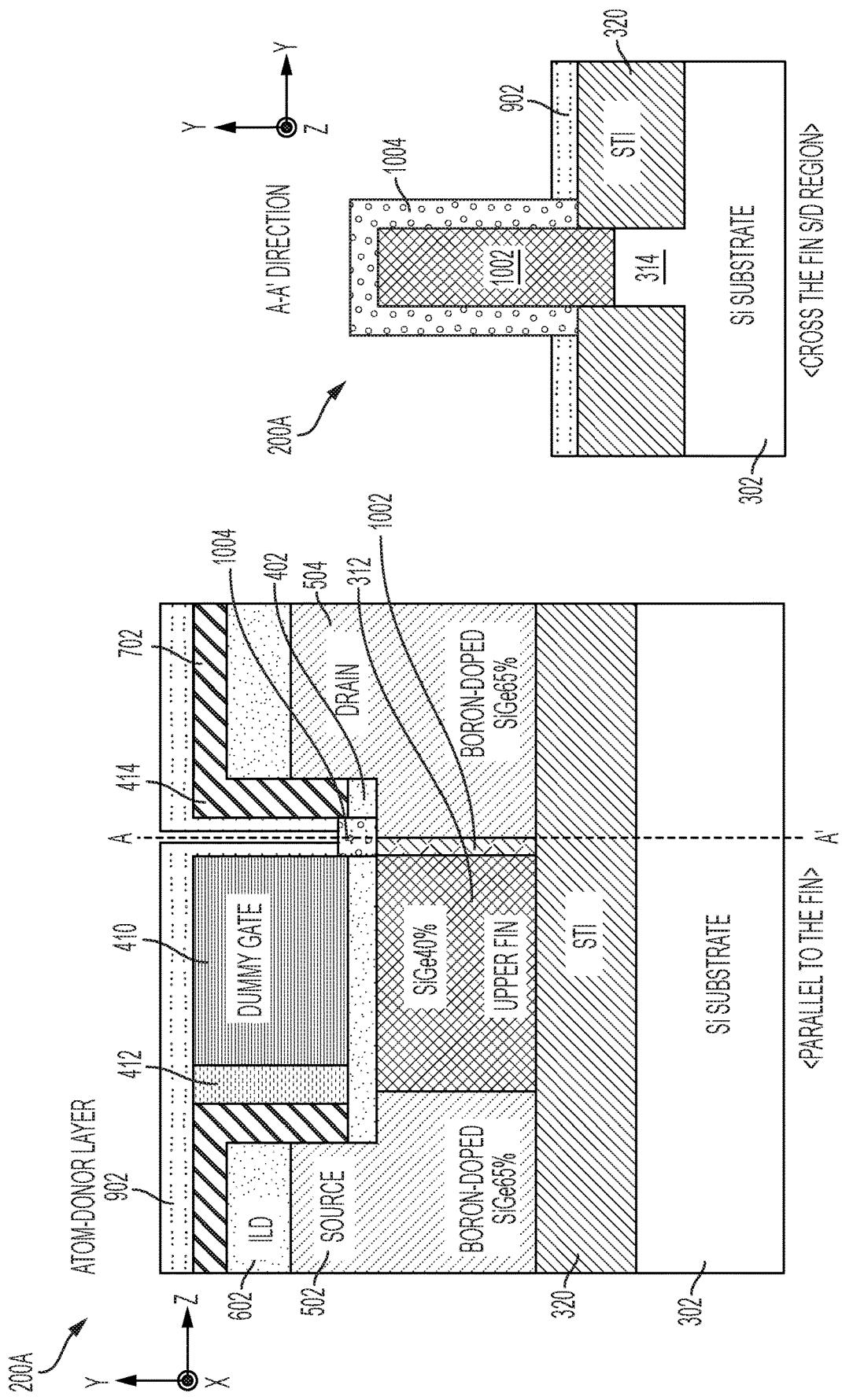

In accordance with aspects of the invention, after the atom-donor layer 902 shown in FIGS. 9A and 9B is deposited, a germanium pull-out process is accordance with aspects of the invention is initiated. FIG. 10 depicts a diagram illustrating a pre-anneal structure and a post-anneal structure that is an example of a germanium pull-out process in accordance with aspects of the invention. As shown in FIG. 10, the pre-anneal structure is a $SiGeO_x$ layer 902A over a SiGe 40% 312A. In the example shown in FIG. 10, the $SiGeO_x$ layer 902A corresponds to the atom-donor layer 902 (shown in FIGS. 9A and 9B), and the SiGe 40% layer 312A corresponds to the exposed portion of the SiGe 40% channel fin 312 (shown in FIGS. 9A and 9B) substantially positioned at the channel-drain interface. The post-anneal structure is a $SiO_2$ layer 1004A over a Si-rich SiGe layer 1002A, which is over a SiGe 40% layer 312B. The $SiO_2$ layer 1004A corresponds to the $SiO_2$ layer 1004 (shown in FIGS. 11A and 11B), the Si-rich SiGe layer 1002A corresponds to the enriched band gap layer 1002 (shown in FIG. 2 and FIGS. 11A and 11B), and the SiGe 40% layer 312B corresponds to the remaining portion of the channel fin 312 (shown in FIGS. 11A and 11B) after formation of the enriched band gap layer 1002.

The SiGeOx layer 902A is a mixture of SiOx and GeOx. An anneal is applied (e.g., a spike anneal between about 970 Celsius and about 1077 Celsius) that raises the temperature of the SiGeOx layer 902A and the SiGe 40% layer 312A to about the melting point of Ge. In embodiments of the invention, at least one anneal is performed in an inert gas environment, and the inert gas can include nitrogen, argon, helium, and neon. As the temperature of the Ge atoms increases, the Ge atoms begin to vibrate. As the temperature of the Ge atoms approach the melting point of Ge, the Ge atoms nearest the surface vibrate enough to break the bonds that hold the Ge atoms in the SiGe 40% layer 312A and the SiGeOx 902A, thereby extracting Ge from the SiGe 40% layer 312A, and also extracting GeO$_x$ from the SiGeO$_x$ layer 902A. The extracted Ge and GeO$_x$ react. In embodiments of the invention where x=2, Ge and GeO$_2$ react according to the equation Ge+GeO$_2$=2GeO shown in FIG. 10. GeO is a volatile product that can be removed by evaporation, for example.

Extracting Ge atoms from the surface of the SiGe 40% layer 312A reduces the Ge concentration in a surface layer of the SiGe 40% region 312A. As the Ge+GeO$_2$=2GeO reaction proceeds, the reduced Ge concentration layer grows, thereby moving from the outer surfaces of the SiGe 40% layer 312A inward to form the Si-rich SiGe layer 1002A. As the Ge concentration of the Si-rich SiGe layer 1002A is reduced, its Si concentration increases, thereby increasing the band gap of the layer 1002A. The final Si and Ge concentrations in the Si-rich SiGe layer 1002A are controlled according to a number of parameters (e.g., anneal temperature, anneal duration, thickness of the SiGeO$_x$ layer 902A, starting Ge % in the SiGe layer 312A, etc.) to achieve a desired difference between the band gap of the SiGe 40% layer 312B and the band gap of the Si-rich SiGe layer 1002A. More specifically, with respect to the semiconductor structure 200A shown in FIGS. 11A and 11B, the final Si and Ge concentrations in the enriched band gap layer 1002 are controlled according to a number of parameters (e.g., anneal temperature, anneal duration, thickness of the atom-donor layer 902, starting Ge % in the SiGe channel fin 312, etc.) to achieve a desired difference between the band gap of the SiGe 40% channel fin 312 (at the channel-drain interface) and the band gap of the enhanced band gap layer 1002. In embodiments of the invention, the desired band gap difference is sufficient to maintain GIDL currents below a predetermined level. In the example embodiments of the invention illustrated herein, the Ge % (about 20%) in the enhanced band gap layer 1002 is approximately ½ of the Ge % (about 40%) in the channel fin 312.

Continuing with FIG. 10, with respect to the SiGeOx layer 902A, extracting GeO$_x$ from the surface of the SiGeO$_x$ layer 902A removes GeO$_x$ at a surface of the SiGeO$_x$ layer 902A, thereby converting the surface of the SiGeO$_x$ layer 902A to a surface layer of SiO$_2$. As the Ge+GeO$_2$=2GeO reaction proceeds, the SiO$_2$ layer grows and moves from the surface that interfaces with the SiGe 40% layer 312A through the SiGeO$_x$ layer 902A to form, post-anneal, the SiO$_2$ layer 1004A.

As depicted in FIGS. 10, 11A, and 11B, the pull-out process in accordance with aspects of the invention is well-controlled, as the reaction of extracted Ge with extracted GeO$_x$ only occurs during the spike anneal. The selective Ge and GeOx extractions are therefore self-limited and will continue until either all of the SiGeO$_x$ is converted to SiO$_2$ or the all of the Ge has been removed from the SiGe enhanced band gap layer 1002, in which case the reaction (Ge+GeO$_2$=2GeO) cannot proceed. In some embodiments of the invention, the Ge pull-out process is controlled such that the entire layer 1002 is converted to a Si-rich level. In some embodiments of the invention, the Ge pull-out process can be controlled such that a portion of the layer 1002 is not converted to a Si-rich material and remains SiGe 40%.

Figure 12:
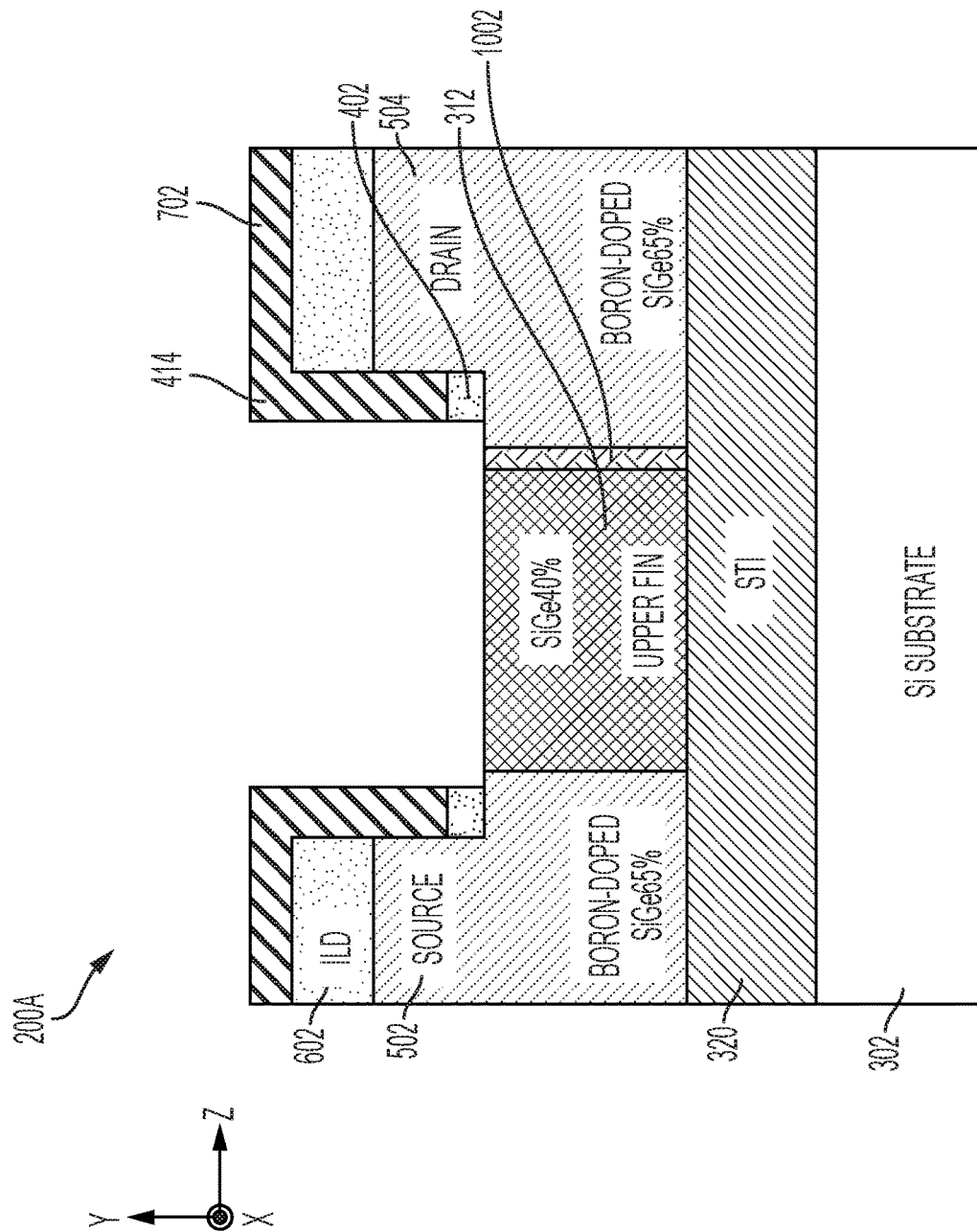

In FIG. 12, at the end of spike anneal and the Ge+GeO$_2$=2GeO reaction, a hydrofluoric acid etchant that is selective to oxide materials, for example, can be used to remove the SiO$_2$ converted layer 1004, along with any remaining unreacted SiGeO$_x$ portions of the atom-donor layer 902. Additionally, known fabrication operations have been used to remove the dummy gate 1202, the first spacer 412 at the channel-source interface, and the portion of the dummy oxide 402 that was under the dummy gate 410 and the first spacers 412. Known semiconductor fabrication operations are then applied to the semiconductor structure 200A at the fabrication stage shown in FIG. 12 to deposit the gate dielectric layer 1204 (shown in FIG. 2) and the metal gate 1202 (shown in FIG. 2), thereby forming the final semiconductor structure 200 shown in FIG. 2. The metal gate 1202 can be formed as part of a replacement metal gate (RMG) process in which the dummy gate 410 (shown in FIGS. 4A and 4B) is used as a placeholder for the metal gate 1202 until the final fabrication operations in which the dummy gate 410 is replaced with the metal gate 1202. The dummy gate 410 is fabrication from a material (e.g., a-Si) that is more compatible with CMOS processing operations than metals.

The methods described herein are used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/ connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a semiconductor device, the method comprising:
    forming a channel region comprising a channel region semiconductor material having a first energy band gap characteristic;
    forming a source region communicatively coupled to the channel region;
    forming a drain region communicatively coupled to the channel region;
    forming a gate region communicatively coupled to the channel region;
    forming an enhanced band gap region substantially positioned at an interface between the channel region and the drain region;
    wherein the enhanced band gap region comprises an enhanced band gap region semiconductor material having a second band gap energy characteristic;
    wherein the first energy band gap is less than the second energy band gap;
    wherein forming the enhanced band gap region comprises converting a portion of the channel region to the enhanced band gap region; and
    wherein converting the portion of the channel region comprises:
        forming a sacrificial atom-donor layer on a portion of an outer surface of the channel region, wherein the portion of the outer surface of the channel region is adjacent the interface between the channel region and the drain region; and
        annealing the channel region and the sacrificial atom-donor layer to pull targeted atoms from the channel region and the sacrificial atom-donor layer.

2. The method of claim 1, wherein:
    the channel region semiconductor material comprises silicon germanium (SiGe); and
    the targeted atoms comprise germanium (Ge) atoms from the channel region semiconductor material.

3. The method of claim 2, wherein:
    the sacrificial atom-donor layer comprises silicon germanium dioxide (SiGeO$_2$); and
    the targeted atoms comprise germanium (Ge) atoms and oxide (O) atoms from the sacrificial atom-donor layer.

4. The method of claim 3, wherein the targeted atoms react to form 2GeO.

5. The method of claim 4, wherein pulling the targeted atoms from the portion of the channel region reduces a Ge percentage of the channel region.

6. The method of claim 5, wherein pulling the targeted atoms from the sacrificial atom-donor layer converts at least a portion of the atom-donor layer to silicon dioxide (SiO$_2$).

7. The method of claim 6 further comprising, subsequent to annealing the channel region and the sacrificial atom-donor layer, removing the sacrificial atom-donor layer.

8. A method of forming a semiconductor device, the method comprising:
    forming a fin;
    forming a source region in the fin;
    forming a drain region in the fin;
    forming a gate region over a portion of the fin, wherein the portion of the fin that is under the gate region defines a channel region, wherein the channel region is between and communicatively coupled to the source region and the drain region;
    wherein the channel region comprises a channel region semiconductor material having a first energy band gap characteristic;
    forming an enhanced band gap region substantially positioned at an interface between the channel region and the drain region;
    wherein the enhanced band gap region comprises an enhanced band gap region semiconductor material having a second band gap energy characteristic;
    wherein the first energy band gap is less than the second energy band gap;
    wherein forming the enhanced band gap region comprises converting a portion of the channel region to the enhanced band gap region;
    wherein converting the portion of the channel region comprises:
        forming a sacrificial atom-donor layer on a portion of an outer surface of the channel region, wherein the portion of the outer surface of the channel region is adjacent the interface between the channel region and the drain region; and
        annealing the channel region and the sacrificial atom-donor layer to pull targeted atoms from the channel region and the sacrificial atom-donor layer.

9. The method of claim 8, wherein:
    the channel region semiconductor material comprises silicon germanium (SiGe); and
    the targeted atoms comprise germanium (Ge) atoms from the channel region semiconductor material.

10. The method of claim 9, wherein:
    the sacrificial atom-donor layer comprises silicon germanium dioxide (SiGeO$_2$); and
    the targeted atoms comprise germanium (Ge) atoms and oxide (O) atoms from the sacrificial atom-donor layer.

11. The method of claim 10, wherein the targeted atoms react to form 2GeO.

12. The method of claim 11, wherein pulling the targeted atoms from the portion of the channel region reduces a Ge percentage of the channel region.

13. The method of claim 12, wherein pulling the targeted atoms from the sacrificial atom-donor layer converts at least a portion of the atom-donor layer to silicon dioxide (SiO$_2$).

14. The method of claim 13 further comprising, subsequent to annealing the channel region and the sacrificial atom-donor layer, removing the sacrificial atom-donor layer.

\* \* \* \* \*